United States Patent [19]

Salmon et al.

[11] Patent Number: 5,298,807
[45] Date of Patent: Mar. 29, 1994

[54] BUFFER CIRCUITRY FOR TRANSFERRING SIGNALS FROM TTL CIRCUITRY TO DUAL RANGE CMOS CIRCUITRY

[75] Inventors: Joseph H. Salmon, Placerville; Clyde L. Johnson, Rancho Cordova, both of Calif.

[73] Assignee: Intel Corporation, Santa Clara, Calif.

[21] Appl. No.: 813,148

[22] Filed: Dec. 23, 1991

[51] Int. Cl.⁵ .............. H03K 19/092; H03K 19/088
[52] U.S. Cl. ..................... 307/475; 307/451; 307/456
[58] Field of Search .............. 307/475, 451, 456

[56] References Cited

U.S. PATENT DOCUMENTS

| | | | |
|---|---|---|---|
| 3,980,896 | 9/1976 | Kato | 307/451 |
| 4,504,746 | 3/1985 | Segawa et al. | 307/475 |
| 4,568,844 | 2/1986 | O'Connor | 307/450 |
| 4,571,504 | 2/1986 | Iwamoto et al. | 307/451 |
| 4,574,273 | 3/1986 | Atsumi et al. | 307/451 |
| 4,584,491 | 4/1986 | Ulmer | 307/451 |
| 5,144,167 | 9/1992 | McClintock | 307/451 |

Primary Examiner—Edward P. Westin
Assistant Examiner—Richard Roseen
Attorney, Agent, or Firm—Blakely, Sokoloff, Taylor & Zafman

[57] ABSTRACT

A buffer circuit including a first N channel field effect transistor including a source terminal connected to ground, a gate terminal connected to a source of input signals, and a drain terminal; a W channel field effect transistor having a source terminal connected to the drain terminal of the N channel field effect transistor, a drain terminal connect to a source of varying voltage, and a gate terminal connected to its drain terminal; and an inverter having an input terminal connected to the drain terminal of the N channel transistor, and an output terminal.

5 Claims, 1 Drawing Sheet

BUFFER CIRCUITRY FOR TRANSFERRING SIGNALS FROM TTL CIRCUITRY TO DUAL RANGE CMOS CIRCUITRY

BACKGROUND OF THE INVENTION

1. Field Of The Invention

This invention relates to digital circuits and, more particularly, to apparatus for providing an input buffer which operates reliably at two different source voltage levels.

2. History Of The Prior Art

Many different types of digital circuits are manufactured today. For example, digital integrated circuits are often manufactured as transistor-transistor-logic (TTL) circuits or complementary metal-oxide-silicon (CMOS) circuits. Although circuits of different types may provide identical logical functions, the logic levels and other characteristics of the circuits are usually different. It is often necessary to join circuits of one of these types to circuits of the other type and guarantee that both circuits will operate reliably. This typically requires a buffer circuit which converts input signals presented at levels convenient for one type of circuitry to those convenient for the other type of circuitry.

The design of buffer circuits is not especially complicated where each of the input and the output circuitry is expected to operate with only two digital signal levels to produce the necessary zero and one logical values. However, many modern circuits operate at more than one range. For example, many modern portable computers provide a normal power mode for carrying out the normal functions of the computer and a standby power mode in which only a limited number of the normal functions are maintained. Usually such computers include circuitry for placing the computer in the standby mode automatically after a selected period of time in order to conserve the batteries utilized to operate such portable devices. In this standby mode, for example, power may be provided to maintain information in a static random access memory so that when the computer is switched to the normal mode, data is immediately available. It is usual for digital circuitry to function with source voltages of a first high level in the normal mode and source voltages of a second lower level in the standby mode. The use of different source voltages requires that the digital buffer circuitry be capable of functioning at both levels while receiving signals adapted to be used with a different type of circuitry.

Multiple operating modes may be provided for many other battery operated digital systems. For example, automobiles provide only battery power to operate the various electrical devices which they carry. Automobiles have become more and more dependent on the use of microprocessors and other digital circuitry to carry out various functions. These microprocessors and similar modern digital circuits used in automobiles are often CMOS integrated circuits. However, these circuits often receive inputs from TTL circuitry which monitors various functions of the automobile. Consequently, buffers must be provided which are capable of transferring signals between the two types of circuits when at least one of those circuits operates at more than one operating range. Digital circuits able to function in automobiles are especially difficult to design because of the temperature extremes such circuits must undergo.

SUMMARY OF THE INVENTION

It is, therefore, an object of the present invention to provide an input buffer for transferring signals between TTL and CMOS circuitry which will operate reliably over a wide range of temperatures and with two different source voltages.

It is another more specific object of the present invention to provide an input buffer between TTL and CMOS circuitry which will operate with two different source voltages over a wide range of process variations, temperatures, and voltage sources.

These and other objects of the present invention are realized in a buffer circuit comprising a first N channel field effect transistor comprising a source terminal connected to ground, a gate terminal connected to a source of input signals, and a drain terminal; a W channel field effect transistor having a source terminal connected to the drain terminal of the N channel field effect transistor, a drain terminal connect to a source of varying voltage, and a gate terminal connected to its drain terminal; and an inverter having an input terminal connected to the drain terminal of the N channel transistor, and an output terminal.

These and other objects and features of the invention will be better understood by reference to the detailed description which follows taken together with the drawings in which like elements are referred to by like designations throughout the several views.

DETAILED DESCRIPTION OF THE INVENTION

Figure 1:
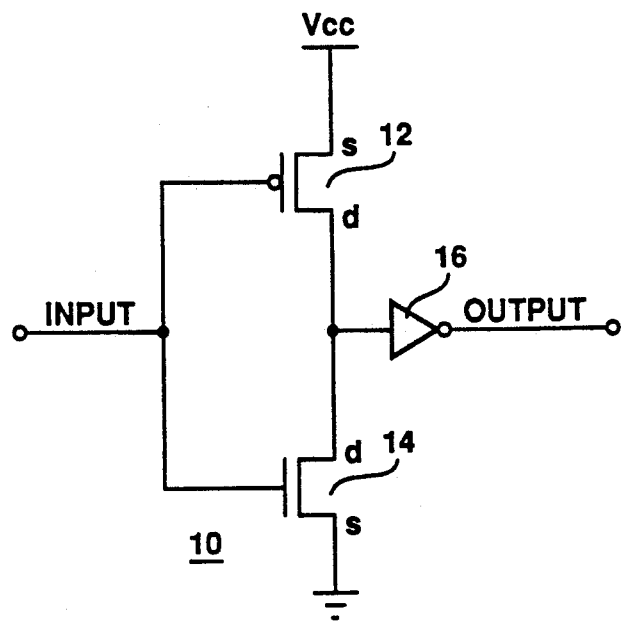
FIG. 1 is a circuit diagram illustrating a circuit constructed in accordance with the prior art.

Referring now to FIG. 1, there is illustrated a circuit 10 constructed in accordance with the prior art. The circuit 10 is a buffer designed to transfer input signals from TTL circuitry to CMOS circuitry. Typically, the voltage levels of signals provided by the TTL circuitry are a high voltage level of 2.0 volts signifying a one logic value (VIH) and a low voltage level (VIL) of 0.8 volts signifying a zero value. It is, of course, necessary that the buffer circuitry recognize these signals and translate them to values which may be utilized in by the CMOS circuitry for which the buffer circuit 10 provides signals.

To accomplish this, the circuit 10 includes a P channel field effect transistor (FET) device 12 and an N channel field effect transistor device 14 arranged with their source and drain terminals connected in series between a voltage source Vcc and ground. The source terminal of the P channel device 12 connects to the source voltage, and the source terminal of the N channel device 14 connects to ground. The gate terminals of the P channel device 12 and the N channel device 14 are connected together to receive an input voltage signal from the associated TTL circuitry and with an inverter 16 convert this input signal into a signal which may be used within the CMOS circuitry.

In the normal operating range of the circuit 10, Vcc is five volts, plus or minus 10%. In the temperature range at which the circuitry must operate, the circuitry must be designed for a low operating temperature of −40 degrees Centigrade. At this temperature, the turn-on voltage (Vt) between the gate and source of the P channel device 12 will typically be 0.9 volts. However, transistor devices differ even though formed by the same manufacturing process; and very slow devices will have greater Vt levels than do typical or fast devices. Consequently, at the specified low temperature, the turn-on voltage (Vt) between the gate and source of the channel device 12 may be as high as 1.2 volts for a slow process device. In a similar manner, the turn-on voltage of the N channel device 14 could be as high as 1.2 volts for a slow process device. With a five volt source voltage Vcc, the device 12 is turned on and the device 14 is turned off by a zero volt CMOS signal. Likewise, a Vcc level CMOS signal will turn on device 14 and turn off the device 12.

The typical values with which a CMOS circuit could be expected to operate are approximately a high input voltage level (VIH) equal to 0.7 multiplied by Vcc and a low input voltage level (VIL) equal to 0.2 multiplied by Vcc. In other words, the high voltage level to be recognized as a one logic value is 0.7 multiplied by 5 volts or 3.5 volts while the low voltage level to be recognized as a zero is 0.2 multiplied by 5 volts or 1 volt. Both of these values fall within the range for which the devices 12 and 14 are biased to operate over the operating temperatures to be expected.

If, however, the circuit 10 is to operate in a second low source voltage mode in which Vcc is only two volts, the greatest turn-on voltage (Vt) of the P channel device 12 and the N channel device 14 will remain at the same value of 1.2 volts at the temperature range expected. Were the input voltages to be furnished by CMOS circuitry, both the P channel device 12 and the N channel device 14 would function correctly since the gate-source voltage of both devices is greater than the highest Vt. For example, a VIH level of 1.4 volts (0.7 multiplied by 2.0 volts) gives a gate-source voltage (Vgs) of 1.4 volts for the N channel device 14 and a Vgs of 0.6 volts for the P channel device 12. In this example, the N channel device 14 will be on since Vgs is greater than Vt; and the P channel device 12 will be off since Vgs is less than Vt. Proper sizing of the P channel device 12 and the N channel device 14 will insure that the circuit will function for the lower Vt cases. A VIL level of 0.4 volts (0.2 multiplied by 2.0 volts) also functions correctly since the Vgs of P channel device 12 is 1.6 volts which is greater than the highest Vt and the Vgs of the N channel device 14 is 0.4 volts which is less than Vt.

Unfortunately, the input voltage levels which are available for input to the circuit 10 are not those normally utilized with CMOS circuitry but those furnished by TTL circuitry. The lowest signal level available to provide a zero level input is 0.8 volts. In the low source voltage mode of operation of the circuit 10, the turn-on voltage Vt of the P channel device 12 is simply too high for the P channel device to operate reliably. If the input to the buffer is at the TTL VIL level of 0.8 volts, the N channel device is off since Vgs is less than Vt; and the P channel device is on the verge of being off since Vgs of the P channel device is at 1.2 volts. The 1.2 volts Vgs is equal to the worst case Vt and consequently provides no margin for error in the worst case condition. This margin is not satisfactory since any slight deviation could result in the remaining buffer stages being driven by a floating node. Consequently, the circuit 10 will not function reliably at this level of input.

Figure 2:
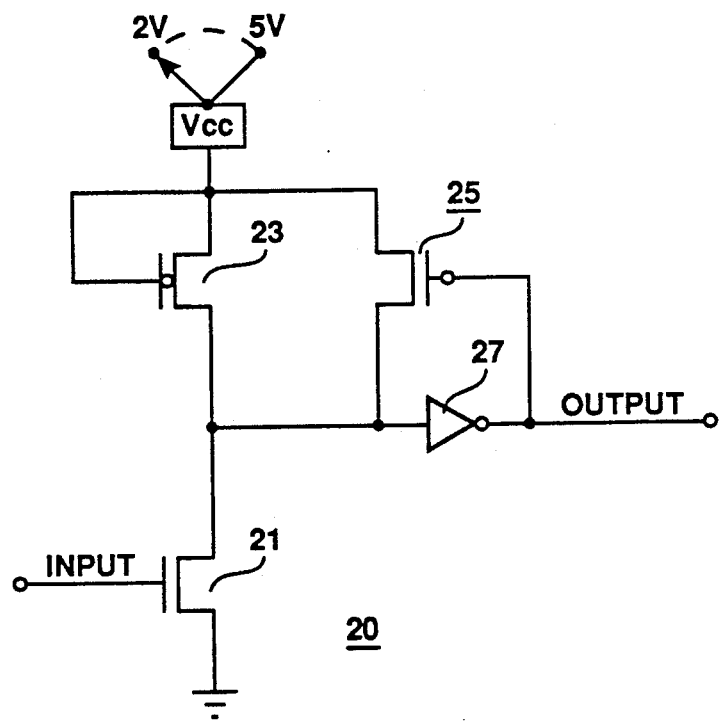
FIG. 2 is a circuit diagram illustrating a circuit constructed in accordance with the present invention.

FIG. 2 illustrates a circuit 20 designed in accordance with the present invention which overcomes the problems of the prior art. The circuit 20 includes an N channel device 21 having its source terminal connected to ground, its gate terminal connected to a source of input signals from a TTL circuit, and its drain terminal connected to the source terminal of a weak (W) device 23. The device 23 is a W channel field effect transistor. The device 23 has both its drain terminal and its gate terminal connected to Vcc. A weak device is structured as a no-implant device so that the normal switching voltage Vt which may be expected is zero. Such a no-implant device is also sometimes referred to as a low threshold device. The manufacture of such a device is taught in U.S. Pat. No. 4,052,229, 4,096,584, and 4,103,189. Consequently, tying the gate terminal of the device 23 to the drain terminal places the device in a normally saturated operating condition so that current flows constantly. In the saturation condition, the current through the device remains relatively constant for any particular drain-to-source voltage. However, the impedance of the device 23 changes with Vcc such that the switching point of the circuit is relatively high at low Vcc and relatively low at higher Vcc.

The circuit 20 is devised to be used as a buffer circuit for the TTL level input signals which cause the associated CMOS circuit to move between the normal power mode and the low power mode. Consequently, the circuit 20 need only respond to the low and high TTL voltage levels during certain conditions. During normal conditions of Vcc=5.0 volts, plus or minus 10%, the buffer must respond to both TTL high and low level inputs. However, during power down conditions the buffer need only respond to a TTL VIL level since the power down signal must be asserted (VIL) before the power supply moves down to 2.0 volts and deasserted only after the power supply has moved back to the normal operating range voltage. When a TTL low level input of 0.8 volts is applied to device 21, the device 21 is turned off or nearly turned off, allowing the weak device 23 to apply a voltage near Vcc minus Vtw to the subsequent inverter stage 27. After a VIL level voltage is applied to the gate of the device 21, the source voltage may be switched to 2.0 volts (possibly by a ramped signal) by externally controlled switching circuitry (not shown). At 2.0 volts the device 21 will still be off, or nearly off, with its gate at an input level of 0.8 volts. It should be noted that in this low power condition, the input stage draws little or no current through the device 21, a desirable condition.

When the CMOS circuitry is to be switched to the normal power mode, the drain terminal of the weak device 23 is 5.0 volts, plus or minus 10%. An input signal of 2.0 volts between the gate and source terminals of the device 21 is sufficient to turn on that device 21 and, due to proper sizing of the devices 21 and 23, apply near zero volts to the input of the subsequent inverter stage 27. In the normal power mode of operation, the device 21 consumes current; however, this is not a low power condition, and the power consumption is acceptable. Thus, the circuit 20 responds reliably to the TTL input levels over the temperature, voltage, and process ranges specified.

It might be thought that a resistor used in placed of the weak device 23 would furnish the same reliable operation for the circuit 20. However, resistor values are not normally controlled as tightly as the turn-on voltage Vt of the weak device 23 or other devices in a logic process.

In addition to the circuitry already described, the circuit 20 includes a P channel device 25 which introduces hysteresis into the switching stage of the buffer. This hysteresis helps keep the buffer from switching multiple times when a slow moving input signal is applied. This is a common technique in input buffer design. In addition the P device 25 allows the input inverter stage 27 to be driven to near or full Vcc level instead of Vcc minus Vtw when a TTL VIL level is applied to the gate of the device 21.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A buffer circuit comprising a first N channel field effect transistor comprising a source terminal connected to ground, a gate terminal connected to a source of TTL input signals, and a drain terminal; a W channel field effect transistor having a source terminal connected to the drain terminal of the N channel field effect transistor, a drain terminal connect to a source which furnishes voltage values for two operating ranges, and a gate terminal directly connected to its drain terminal whereby the W channel effect transistor remains on and saturated in both of the two operating ranges; and an inverter having an input terminal connected to the drain terminal of the N channel transistor, and an output terminal.

2. A buffer circuit comprising a first N channel field effect transistor comprising a source terminal connected to ground, a gate terminal connected to a source of TTL input signals, and a drain terminal; a W channel field effect transistor having a source terminal connected to the drain terminal of the N channel field effect transistor, a drain terminal connect to a source which furnishes voltage values for two operating ranges, and a gate terminal connected to its drain terminal; an inverter having an input terminal connected to the drain terminal of the N channel transistor, and an output terminal; and a P channel field effect transistor having its source and drain terminals connected between the source which furnishes voltage values for two operating ranges and the input of the inverter, and its gate terminal connected to an output terminal of the inverter.

3. A buffer circuit for transferring TTL level input signals to CMOS circuitry having high and low voltage operating ranges comprising an N channel field effect transistor having gate, source, and drain terminals, the gate terminal being connected as an input terminal for the buffer circuit, the source terminal being connected to a first source of voltage at a first level, and the drain terminal being connected as an output terminal for the buffer circuit; a second source of voltage for furnishing second and third voltage levels each of which is higher than the first level; means connected between the second source of voltage and the drain terminal of the N channel field effect transistor for connecting the second source of voltage to the drain terminal of the N channel field effect transistor while maintaining the current between the second source of voltage and the drain terminal of the N channel device relatively constant whereby the N channel field effect transistor will function to switch with TTL input voltage levels when the second source of voltage furnishes either the second or the third voltage level.

4. A buffer circuit as claimed in claim 3 further comprising an inverter connected to receive the output signal produced at the drain terminal of the N channel field effect transistor as an input signal.

5. A buffer circuit for transferring TTL level input signals to CMOS circuitry having high and low voltage operating ranges comprising an N channel field effect transistor having gate, source, and drain terminals, the gate terminal being connected as an input terminal for the buffer circuit, the source terminal being connected to a first source of voltage at a first level, and the drain terminal being connected as an output terminal for the buffer circuit; a second source of voltage for furnishing second and third voltage levels each of which is higher than the first level; means connected between the second source of voltage and the drain terminal of the N channel field effect transistor for connecting the second source of voltage to the drain terminal of the N channel field effect transistor while maintaining the current between the second source of voltage and the drain terminal of the N channel device relatively constant whereby the N channel field effect transistor will function to switch with TTL input voltage levels when the second source of voltage furnishes either the second or the third voltage level; an inverter connected to receive the output signal produced at the drain terminal of the N channel field effect transistor as an input signal; and a P channel field effect transistor having its source and drain terminals connected between the second source and the input of the inverter, and its gate terminal connected to an output terminal of the inverter.

* * * * *